US005652585A

United States Patent [19]
Leung et al.

[11] Patent Number: 5,652,585
[45] Date of Patent: Jul. 29, 1997

[54] MULTIPLE FUNCTION ANALOG-TO-DIGITAL CONVERTER WITH MULTIPLE SERIAL OUTPUTS

[75] Inventors: Ka Yin Leung; Kafai Leung, both of Austin; Eric J. Swanson, Buda, all of Tex.

[73] Assignee: Crystal Semiconductor Corp., Austin, Tex.

[21] Appl. No.: 416,618

[22] Filed: Apr. 5, 1995

[51] Int. Cl.[6] .................................................. H03M 1/12
[52] U.S. Cl. .............................................. 341/155; 341/143
[58] Field of Search .................................. 341/141, 143, 341/155

[56] References Cited

U.S. PATENT DOCUMENTS

| | | | |
|---|---|---|---|
| 4,564,918 | 1/1986 | McNally et al. | 364/569 |
| 4,716,472 | 12/1987 | McNally | 360/8 |
| 4,748,578 | 5/1988 | Lagadec et al. | 364/724 |
| 4,772,871 | 9/1988 | Suzuki et al. | 341/155 |
| 4,780,892 | 10/1988 | Lagadec | 375/118 |
| 4,825,398 | 4/1989 | Koch et al. | 364/724.1 |
| 4,943,807 | 7/1990 | Early . | |
| 4,972,190 | 11/1990 | Primeau et al. | 341/155 |
| 4,982,193 | 1/1991 | Saul | 341/159 |
| 5,030,954 | 7/1991 | Ribner | 341/172 |
| 5,257,026 | 10/1993 | Thompson et al. . | |
| 5,451,951 | 9/1995 | Elliott et al. | 341/155 |

OTHER PUBLICATIONS

Robert Adams and Tom Kwan, "Theory and VLSI Architectures for Asynchronous Sample–Rate Converters," *J. Audio Eng. Soc.*, vol. 41, No. 7/8, Jul./Aug.
Robert Adams and Tom Kwan, "A Stereo Asynchronous Digital Sample–Rate Converter for Digital Audio," *IEEE Journal of Solid–State Circuits*, vol. 29, No. 4, Apr. 1994.
"Advance Information: DSP56ADC16 16–Bit Sigma–Delta Analog–to–Digital Converter," Motorola, Inc., 1989.
M. S. Ghausi and K. R. Laker, "Modern Filter Design," by Bell Telephone Laboratories, Inc., pp. 342–357, 1981.
R. W. Adams, P. F. Ferguson, Jr., A. Fanesan, S. Vincelette, A. Volpe, and R. Libert, "Theory and Practical Implementation of a Fifth–Order Sigma–Delta A/D Converter," *J. Audio Eng. Soc.*, vol. 39, Nos. 7–8, pp. 515–527, Jul./Aug. 1991.
S. A. Jantzi, W. M. Snelgrove, and P. F. Ferguson, Jr., "A Fourth–Order Bandpass Sigma–Delta Modulator," *IEEE Journal of Solid–State Circuits*, vol. 28, No. 3, pp. 282–291, Mar. 1993.
R. Gregorian and G. C. Temes, "Analog MOS Integrated Circuits for Signal Processing," *A Wiley–Interscience Publication*, John Wiley and Sons, pp. 265–401, 1986.
Lawrence R. Rabiner, Bernard Gold, "Theory and Application of Digital Signal Processing", pp. 328–329.

(List continued on next page.)

*Primary Examiner*—Marc S. Hoff
*Attorney, Agent, or Firm*—Gregory M. Howison

[57] ABSTRACT

An analog-to-digital converter is comprised of an analog delta-sigma modulator (10) and a digital processing section (14). The digital processing section (14) is comprised of a plurality of digital processing sections fabricated on a monolithic device. A high precision FIR filter (20) is provided for providing a high resolution output on a bus (22). Additionally, a low group delay FIR filter (30) is provided to filter the data and provide an output with a much lower delay than that of the FIR filter (20). The output of filter (20) can either be processed through a high-pass filter (40) and/or through a noise shaping psycho-acoustic filter (36) to provide select outputs. These outputs are all input to the serial interface device (52), which is operable to select one of the outputs, that of the filter (30), that of the filter (20), or that of the output of the noise shaping filter (36) or that of the filter (40) for conversion to a serial data stream. Two serial data streams can be generated at the same time from different ones of the inputs. Configuration data can be input to various configuration registers through a data input port (58), this allowing selection of the different functions during the operation thereof.

40 Claims, 8 Drawing Sheets

OTHER PUBLICATIONS

Charles D. Thompson, Salvador R. Bernadas, "A Digitally–Corrected 20b Delta–Sigma Modulator", 1994 IEEE International Solid–State Circuits Conference, pp. 194–195.

Y.Matsuya, K.Uchimura, A.Iwata, T.Kobayashi, "A 16–bit Oversampling A–to–D Conversion Technology Using Triple–Integration Noise Shaping", IEEE Journal of Solid–State Cirucits, vol. SC–22, Dec. 1987, pp. 921–928.

Mehdi Hatamiam and Keshab K. Parhi, "An 85–MHz Fourth–Order Programmable IIH Digital Filter Chip", IEEE Journal of Solid–State Circuits, vol. 27, No. 2, Feb. 1992, pp. 175–183.

David Vallancourt and Yannis P. Tsividis "A Fully Programmable Sampled–Data Analog CMOS Filter with Transfer–Function Coefficients Determined by Timing", IEEE Journal of Solid–State Circuits, vol. SC–22, No. 6, Dec. 1987, pp. 1022–1030.

Kin Lin and John Poulos, "Area Efficient Decimation Filter for an 18–bit Delta–Sigma Analog–to–Digital Convert", AES Feb. 1995, pp. 1–10.

Alan V. Oppenheim and Alan S. Willsky, "Signals and Systems", Analysis and Characterization of LTI Systems Using z–Transforms, Sec. 10.7, 1983.

David Vallancourt and Yannis P. Tsividis, "Timing–Controlled Fully Programmable Analog Signal Processors Using Switched Continuous–Time Filters", IEEE Transactions on Circuits and Systems, vol. 35, No. 8, Aug. 1988, pp. 947–954.

1994 Crystal Semiconductor Audio Databook, pp. 3–143.

DSP56000/DSP56001 Digital Signal Processor User's Manual, Rev. 2, pp. 11-8—11-9, 1990.

Texas Instruments TMS320C3x User's Guide. 1992. pp. 8-12—8-16.

Andreas Antoniou, "Digital Filters", Second Edition, 1993, pp. 366–381.

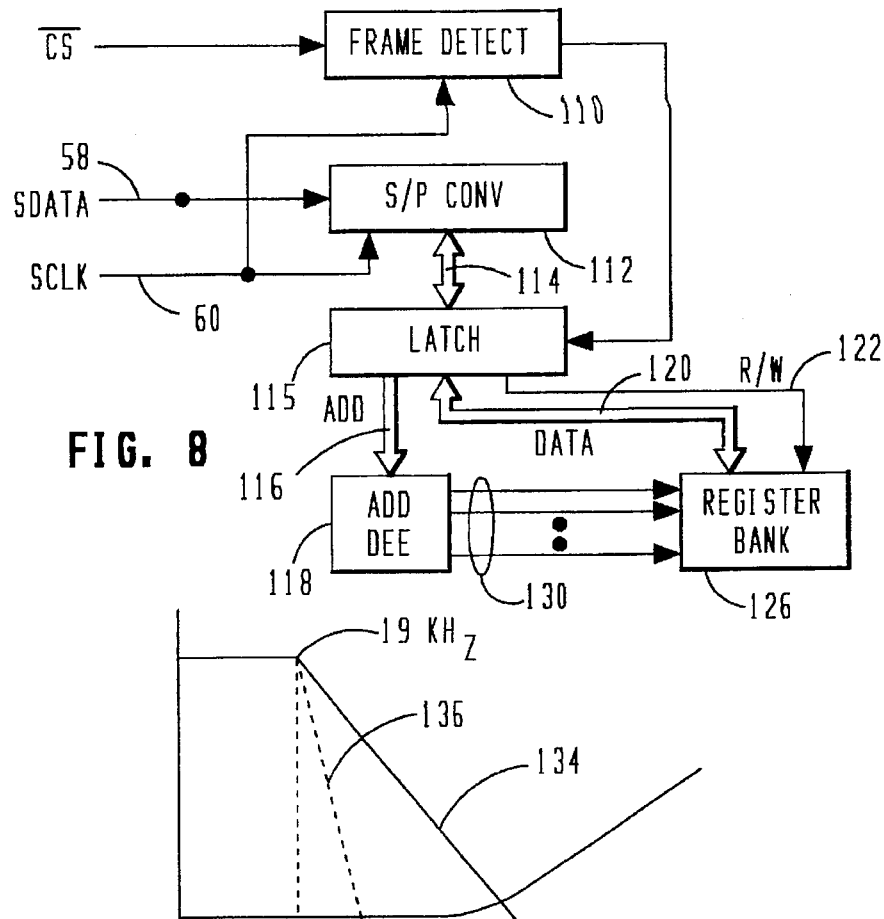
FIG. 8
FIG. 9
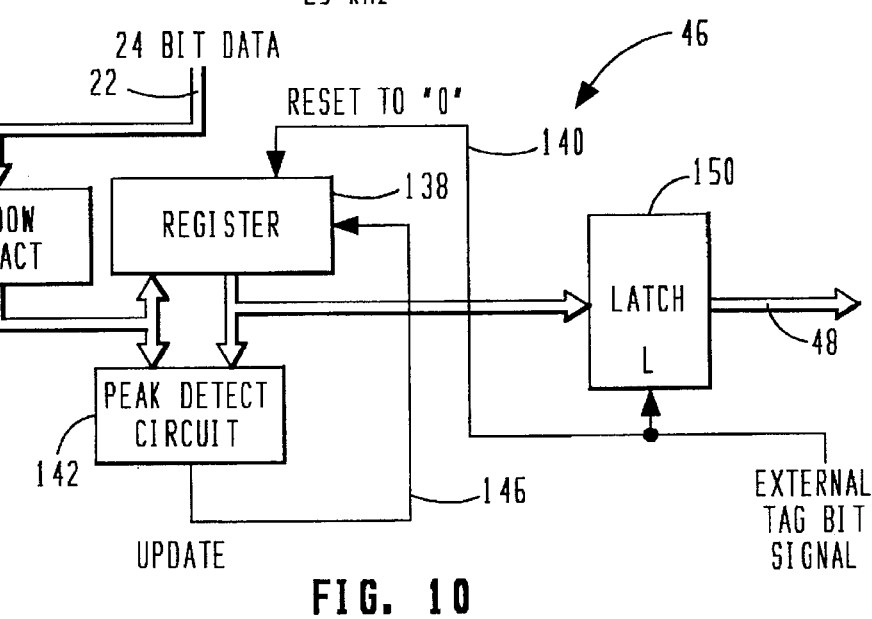
FIG. 10

MULTIPLE FUNCTION ANALOG-TO-DIGITAL CONVERTER WITH MULTIPLE SERIAL OUTPUTS

TECHNICAL FIELD OF THE INVENTION

The present invention pertains in general to analog-to-digital converters, and more particularly, to the digital filter section and the multi-function aspects thereof.

CROSS-REFERENCE TO RELATED APPLICATIONS

This application is related to U.S. patent application Ser. No. 08/413,356, filed Mar. 30, 1995, and entitled, "DIGITAL FILTER WITH DECIMATED FREQUENCY RESPONSE" (Atty. Dkt. No.: CRYS-23,428).

BACKGROUND OF THE INVENTION

Analog-to-digital converters have seen increased use in the audio industry. Due to the increased level of sophistication in the processing of analog information, digital techniques have been utilized to process this analog information. By converting the analog signal into a digital signal and utilizing available digital processing techniques, a higher degree of versatility is provided to the user. This digital processing is utilized to process the information in order to provide various types of outputs after processing. One type of output is a fairy high filtered output that is typically provided by a digital filtering process that requires a very sharp filter response with minimal aliasing. This type of filter, unfortunately, has a significant group delay associated therewith, due to the fact that this type of filter requires a relatively long Finite Impulse Response (FIR) filter. While this is necessary to provide a high quality sound recording, the group delay can present a problem with respect to an artist listening to the soundtrack while it is being recorded. In order to achieve a lower group delay, a much shorter filter with less taps is required, which inherently has a poor filter response.

Other types of processing that can be provided are, for example, a psycho-acoustic filter that shapes the noise response of a given filter output to minimize the noise in the portion of the spectrum associated with the optimum response of the human ear, i.e., approximately two kilohertz, and then increase the noise level above and below that frequency. However, these type of filters require a conversion from a high resolution digital filter output to a low resolution digital filter output.

At present, all the above functions require separate processing systems, most of which are not compatible with each other. This presents a disadvantage to the user in that the user must utilize separate systems for the separate functions and is not provided an easy means to facilitate the different systems.

SUMMARY OF THE INVENTION

The present invention disclosed and claimed herein comprises an analog-to-digital converter having multiple serial ports. An analog modulator is provided for receiving an analog input and outputting a digital signal representative of the analog input signal. A digital processing section is operable to receive the output of the digital processing analog modulator and process the digital output to provide at least two digital serial output signals. The digital processing section includes a plurality of digital processing circuits for receiving the digital output signal output by the analog modulator and process this digital signal with digital processing circuits each having predetermined separate and distinct processing functions to provide on the output of each of the digital processing circuits a processed digital output. These processed digital outputs are input to a serial input device which is operable to select at least one of the processed digital outputs for each of the at least two serial outputs and convert this processed digital output to a predetermined serial format. A configuration device is operable to configure the serial interface device to determine which of the processed digital outputs are selected in response to receiving external configuration data.

In another aspect of the present invention, a select number of the digital processing circuits comprise digital filters having an associated Finite Impulse Response (FIR) filter function. At least two of the digital filters have different group delays associated therewith. The one of the digital filters having the shortest delays has a word length that is shorter than the other one of the two digital filters.

In a yet further aspect of the present invention, a post-processing digital processing circuit is provided that is associated with one of the digital processing circuits is provided. The output of the post-processing digital processing circuit comprises one of the inputs to the serial interface device. The post-processing digital processing circuit comprises a psycho-acoustic filter. The psycho-acoustic digital filter is operable to shape the noise response on the output thereof, the output of the post-digital processing circuit having a word length output that is shorter than the word length on the input thereof.

BRIEF DESCRIPTION OF THE DRAWINGS

For a more complete understanding of the present invention and the advantages thereof, reference is now made to the following description taken in conjunction with the accompanying Drawings in which:

FIG. 8 illustrates a block diagram of the data input portion of the state machine;

FIG. 9 illustrates a frequency diagram for the low group delay filter;

FIG. 10 illustrates a block diagram of the tag word device 46:

DETAILED DESCRIPTION OF THE INVENTION

Figure 1:
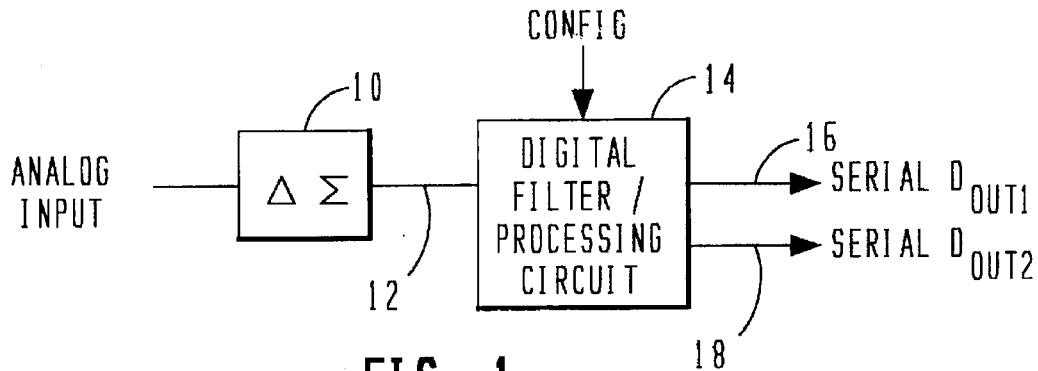
FIG. 1 illustrates an overall block diagram of the data conversion system of the present invention.

Referring now to FIG. 1, there is illustrated an overall block diagram of the present invention. An analog input is received on the input of an analog modulator 10. The analog modulator 10 in the preferred embodiment is a delta-sigma analog modulator. The analog modulator 10 is operable to receive the analog signal on the input thereof and convert it to a digital string of ones and zeroes, this being a 1-bit stream. However, it should be realized that this could be a 2-bit stream. The output of the analog modulator 10 on an output 12 is input to a digital filter/processing circuit 14. As will be described hereinbelow, the processing circuit 14 has internal thereto various FIR filter components that provide filtering and processing of the digital information. This is internally converted to a parallel word and then the digital values selected for various processing steps converted to a serial output stream for output on one of two serial outputs 16 and 18, labeled serial $D_{OUT1}$ and serial $D_{OUT2}$, respectively. Additionally, a configuration input is provided for configuring which of the various processing steps is applied to the digital data and on which output 16 or 18 the processed data is output.

Figure 2:
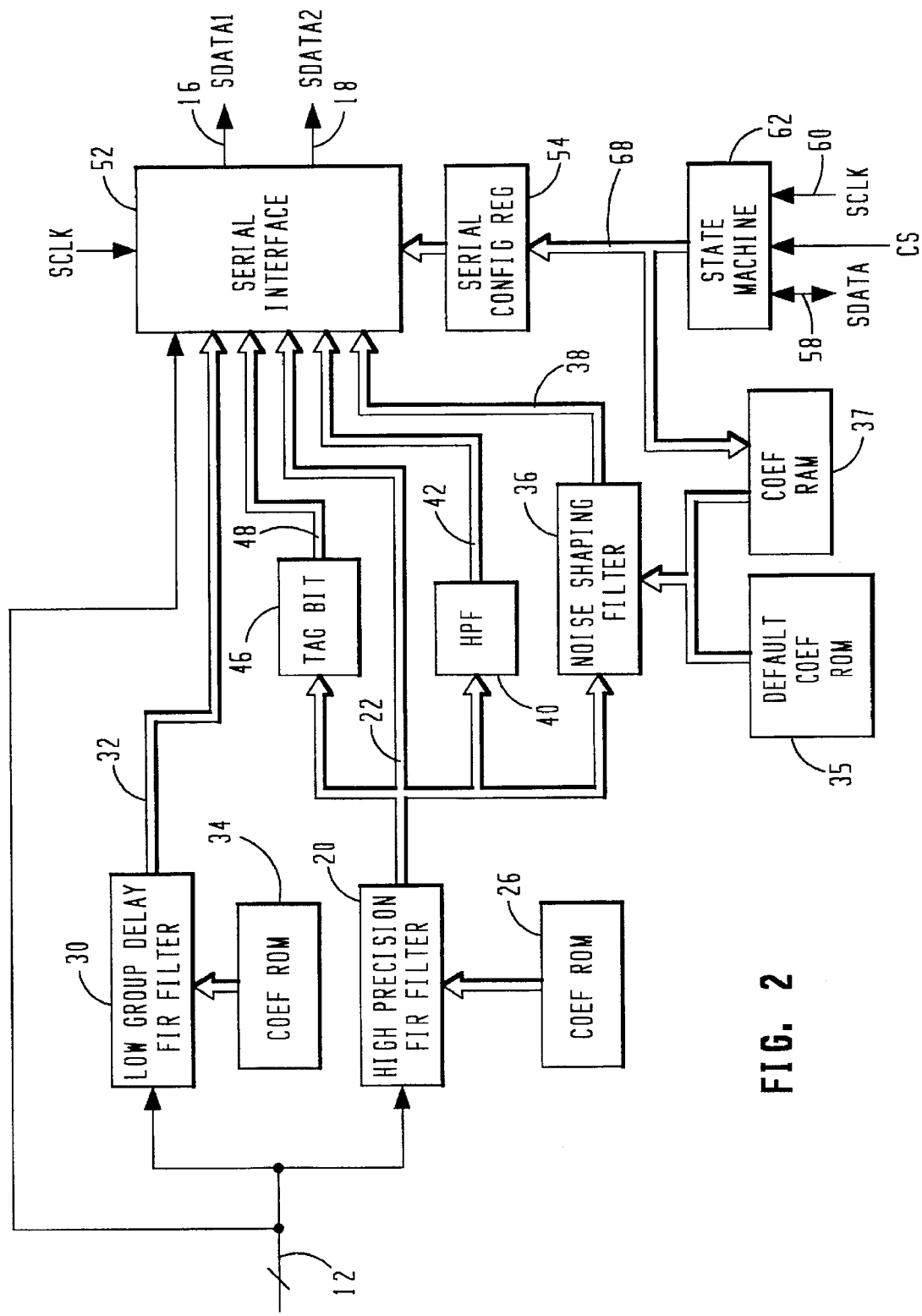
FIG. 2 illustrates a detailed block diagram of the digital filter/processing circuit.

Referring now to FIG. 2, there is illustrated a more detailed block diagram of the digital filter/processing circuit 14 of the present invention. The 1-bit digital stream on the line 12 is input to a high precision FIR filter 20 that is operable to process the 1-bit digital stream on line 12 through a filter function and output a digital word on an output bus 22. In the preferred embodiment, the bus 22 receives an output word 24-bits in length. The FIR filter 20 has a filter function that is a lowpass function and implements a FIR filter with a length of 4096 taps. The coefficients for this filter are stored in a coefficient ROM 26. Additionally, the FIR filter 20 is a filter that has a variable bandwidth that utilizes the same set of coefficients. Although this is not discussed in detail in this application, this is described in U.S. patent application Ser. No. 08/413,356, filed Mar. 30, 1995, entitled, "DIGITAL FILTER WITH DECIMATED FREQUENCY RESPONSE" (Atty. Dkt. No.: CRYS-23,428). This system allows for selection of different bandwidth without providing for any recalibration of the system.

In addition to the high precision FIR filter 20, a low group delay FIR filter 30 is provided which receives on the input thereof the 1-bit digital stream of data on line 12 and provides on an output bus 32 a lower resolution than that output by the high precision FIR filter 20. The FIR filter 30 provides for a lower group delay through the use of a lower number of taps. In the preferred embodiment, as will be described hereinbelow, this is a filter of approximately 300 taps in length. As will also be described hereinbelow, this filter is also utilized for direct feedback to the user. As compared to the high precision FIR filter 20, the lower number of taps allows the information to be propagated therethrough with less delay. The coefficients for this FIR filter 30 are stored in the coefficient ROM 34.

The output of the high precision FIR filter 20 on the bus 22 can be further processed in a number of different ways. In one method, a noise shaping filter 36 is provided for receiving the data word, truncating the word down to a 16-bit word and shaping the output to reduce the noise in the optimal response portion of the spectrum of two kilohertz for a human and push the noise energy from this portion up into the higher and lower portions about the optimum portion. This is referred to as a psycho-acoustic filter. The output, as described above, is a lower resolution output of the order of sixteen bits, which is output on a bus 38. The noise shaping filter 36 has the coefficients thereof stored in a coefficient RAM 37, which coefficient RAM 37 allows for non-volatile storage in order for a user to input desired coefficients. As such, the coefficient RAM 37 allows the noise shaping filter 36 to have the noise shaping response thereof modified. An additional default coefficient ROM 35 is provided which provides for a default set of coefficients, which are utilized on startup. This default set of coefficients is comprised of those typically utilized on startup and typically comprised of those coefficients associated with the response of the human ear; however, one could envision utilizing this with a different frequency response for customization purposes.

In addition to the noise shaping filter 36, a high-pass filter 40 is provided for receiving the 24-bit output from bus 22 and outputting a filtered 24-bit data value on a bus 42. This is a conventional high-pass filter. The 24-bit output on bus 22 is also processed by a tag bit circuit 46 that is operable to select the LSB portion of the 24-bit data word on bus 22 for output on a bus 48 for level-meter display.

The buses 22, 32, 38, 42 and 48 are input to a serial interface device 52. Additionally, the 1-bit bus 12 is input to the serial interface device 52. The serial interface device 52 is operable to receive configuration data which is stored in a configuration register 54 and select one of the inputs thereto, convert it to serial data in accordance with a predetermined format and output it on one of the serial data outputs 16 or 18. The other of the outputs 16 or 18 has one of the inputs to the serial interface device 52 selected for output thereon after conversion to a serial data stream in accordance with the serial data format.

Data is input to the system via a serial data input port 58 and a data clock 60. This is input to a state machine 62 which controls the overall configuration of the system and also the operation of the system. When data is input, it is converted to parallel data and stored in the serial configuration register 54 via a bus 68, which bus 68 also allows input of data to the coefficient RAM 37 with the appropriate signal associated therewith. Additionally, the state machine 62 is operable to control the various filters and the operations thereof.

Figure 3:
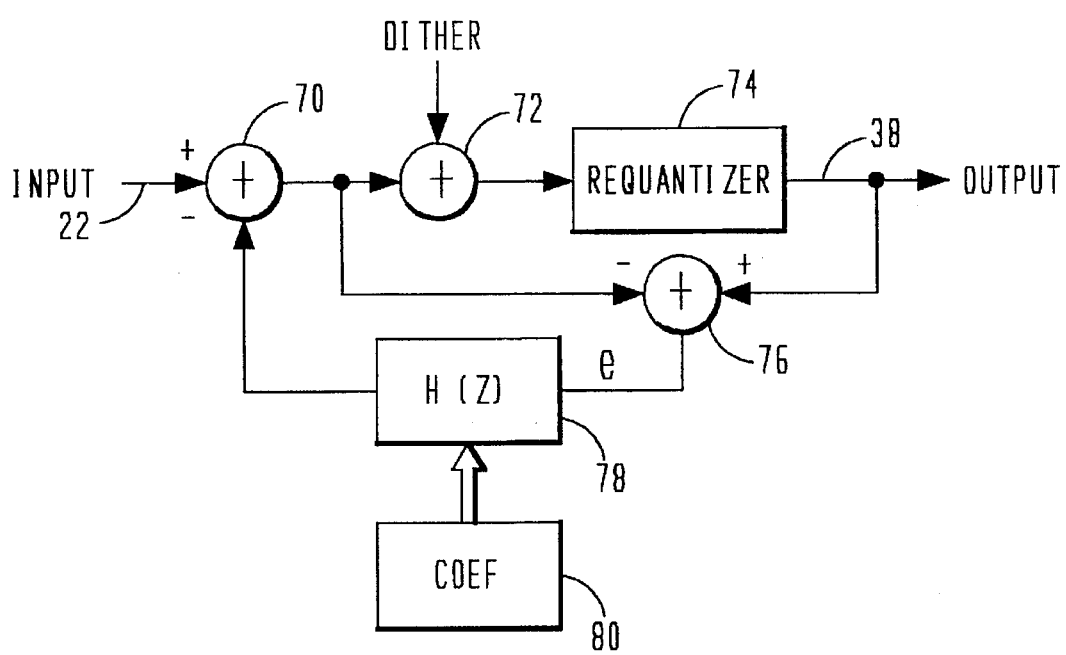
FIG. 3 illustrates a detailed block diagram of the noise shaping filter.

Referring now to FIG. 3, there is illustrated a block diagram of the noise-shaping filter 36. The input to the noise-shaping filter is received from the bus 22, which is then input to a substraction circuit 70. The output of subtraction circuit 70 is input to a summation circuit 72 which is operable to sum the output of the subtraction circuit 70 with a dither signal. This is then output to a requantizer 74, which requantizer 74 is essentially a truncation circuit operable to strip off the eight least significant bits from the 24-bit input word on bus 22 to provide on the output bus 38 a 16-bit word. The output of the requantizer 38, in addition to providing the output, also provides an input to a subtraction circuit 76, the negative input thereof connected to the output of subtraction circuit 70. This provides an error signal "e", which represents the error between the 16-bit word on bus 38 and the 24-bit word on the output of subtraction circuit 70. This is input to a filter 78 having a transform function of H(z). This is a FIR filter which has a coefficient ROM 35 associated therewith. After filtering, the output of the filter 78 is input to the negative input of the subtraction circuit 70. The filter 78 is operable to provide the appropriate shaping to the filter function.

Figure 4:
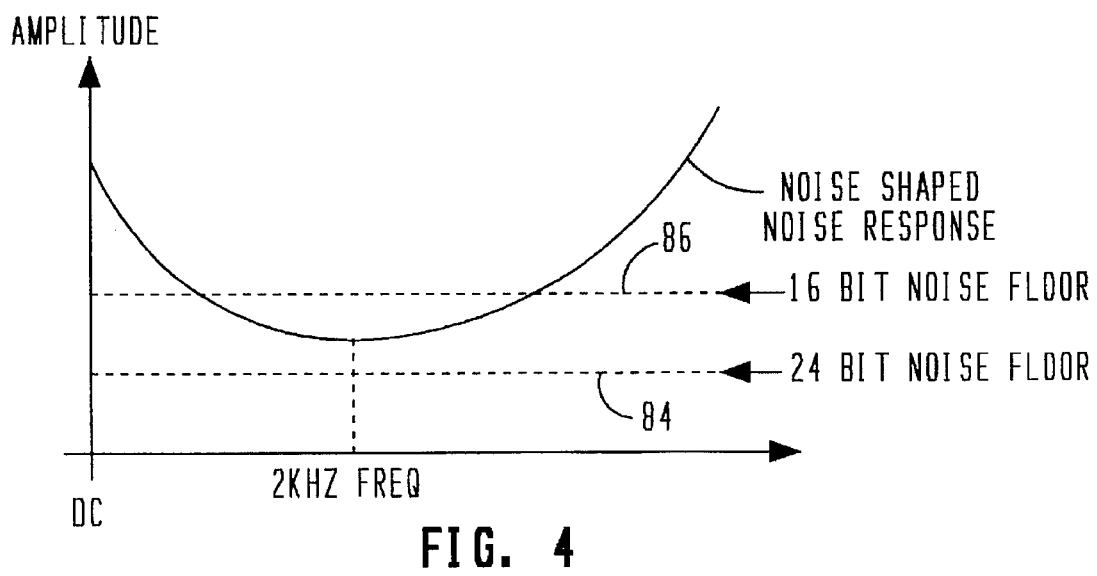
FIG. 4 illustrates a frequency diagram for the noise shaping filter of FIG. 3.

With reference to FIG. 4, there is illustrated a frequency plot depicting the noise shaping operation. Typically, the noise response on a 24-bit filter output is lower than that of a 16-bit filter output after truncation thereof. The 24-bit noise filter is represented by a dotted line 84 and the 16-bit noise filter is represented by a dotted line 86. It can be seen that the truncation error merely raises the noise floor across the frequency band. By utilizing the psycho-acoustic filter of FIG. 3, the noise can be shaped such that it is reduced at a frequency of 2 KHz, but is increased at the low and high end of the band. The overall noise energy is the same or slightly higher, but the noise energy in the center portion around 2 KHz is translated to a higher frequency and a lower frequency. The operation of the psycho-acoustic noise filter is described in U.S. Pat. No. 5,204,677, issued Apr. 20, 1993, and entitled "Quantizing Error Reducer for Audio Signal". This patent is incorporated herein by reference. Further, the psycho-acoustic filter is also described in Robert A. Wannamaker, "Pyscho-Acoustically Optimal Noise Shaping", *Audio Engineering Society Convention*, September 1990, with reference to FIG. 2, which reference is incorporated herein by reference.

It is important to note that in order to utilize a psycho-acoustic filter, that it is necessary to have the function of the requantizer 74. This requires that a higher resolution filter be utilized to generate a higher bit output. For example, it is necessary to generate a 24-bit output in order to optimize the noise response with the psycho-acoustic filter and provide a 16-bit output.

Figure 5A:
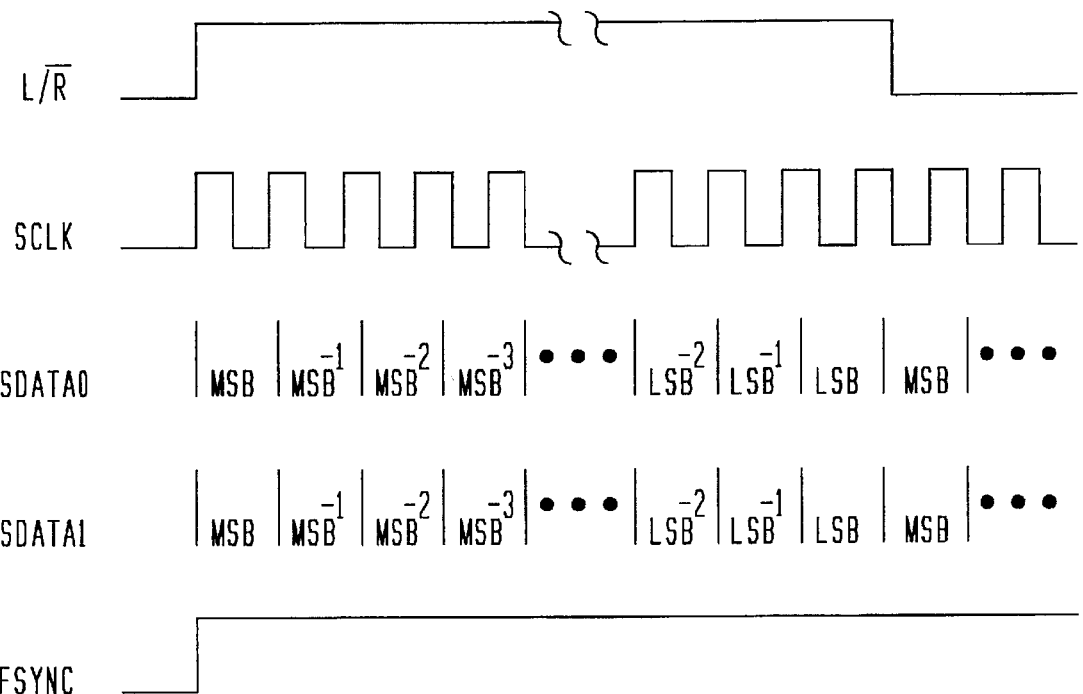
FIGS. 5a and 5b illustrate timing diagrams for the serial data output format.
Figure 5B:
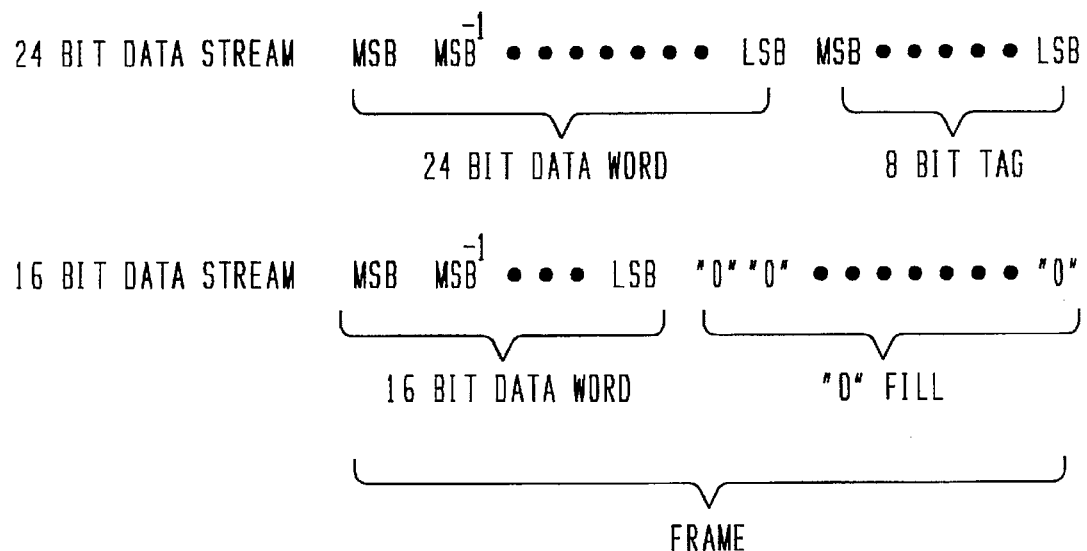

Referring now to FIGS. 5a and 5b, there are illustrated timing diagrams for the format of the serial output data. With specific reference to FIG. 5a, the output is illustrated with the conventional left and right stereo outputs denoted by an L/R-BAR signal. When the signal is high, this indicates the left channel output and when the L/R-BAR signal is low, this indicates the right channel output. A serial clock is provided which has a frequency of 3.072 MHZ. The word rate on the output is 48 KHz. In order to have the 48 KHz output, it will require two 24-bit words to be output at the 48 KHz word rate. Each 24-bit word also has associated therewith the 8-bit tag word. Therefore, each frame associated with the left and right signal will have two 32-bit words for a total of 64 bits. This is illustrated in the SDATA0 and SDATA1 signals, which both have a 24-bit output associated therewith. It can be seen that each word is comprised of the most significant bits of the combined 24-bit word and the tag word as the LSB portion thereof. When the L/R-BAR signal goes low, this is repeated beginning with the MSB of the next combined 24-bit word and tag word. Each frame can be initiated with an FSYNC signal.

With specific reference to FIG. 5b, there is illustrated a comparison between the 24-bit data stream and the 16-bit data stream. The 16-bit data stream does not need a tag word. Therefore, each word will only require sixteen bits of the 16-bit data stream as compared to the thirty-two bits required for the 24-bit data stream. However, each word for both data streams must be output at the same word rate. To facilitate this, the 16-bit data stream is comprised of the 16-bit word, followed by a series of "zeroes" for a total of 64 bits for both the right and left channels.

Figure 6:
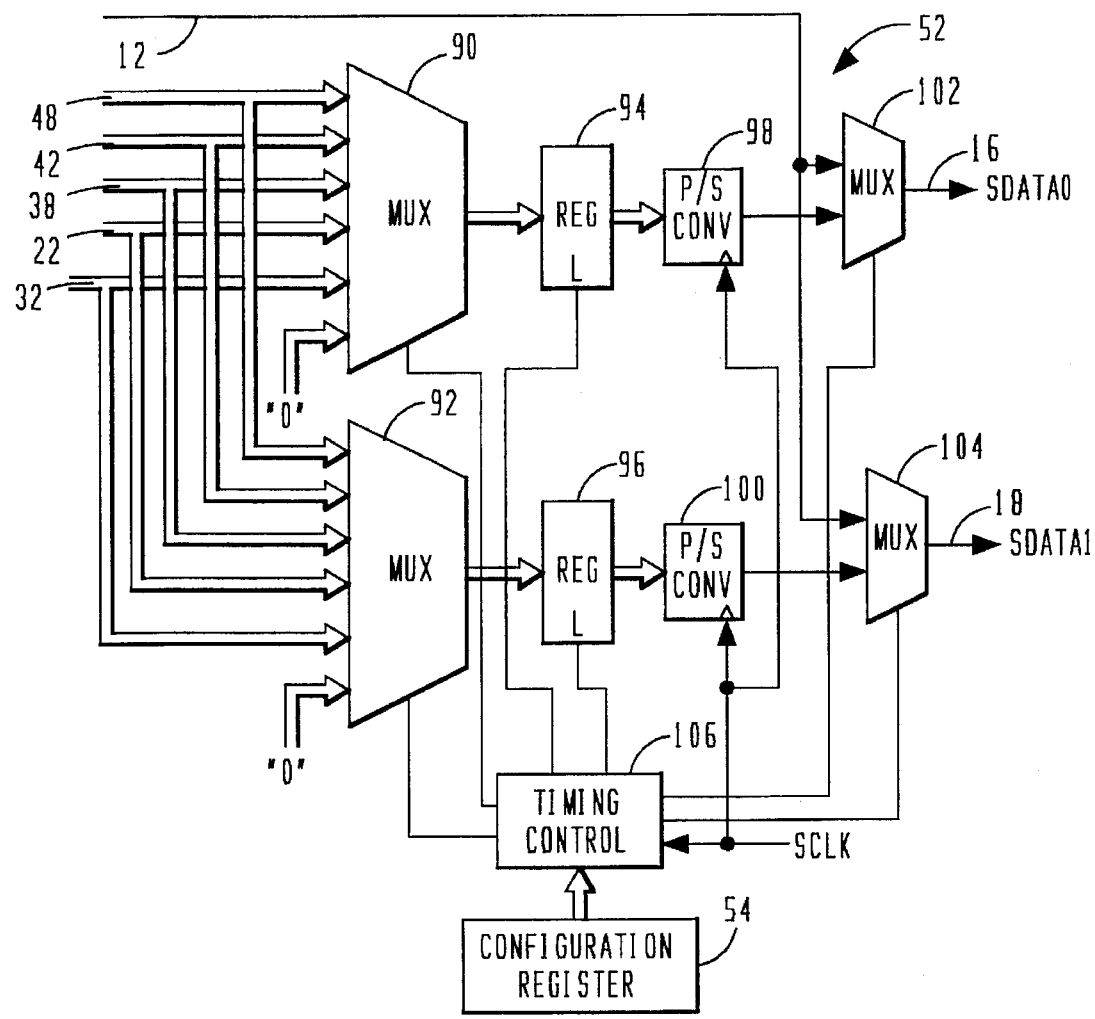
FIG. 6 illustrates a logic diagram for the serial output interface device.

Referring now to FIG. 6, there is illustrated a detailed block diagram of the serial interface device 52. The five buses, 22, 32, 38, 42 and 48 are input to two multiplexers 90 and 92. An additional input to each of the multiplexers 90 and 92 is a "0" input. The output of the multiplexer 90 is input to a latching register 94, the output of multiplexer 92 is input to a latching register 96. Register 94 has the output thereof connected to the input of a parallel-to-serial converter 98 and the output of register 96 has the output thereof connected to the input of the parallel-to-serial converter 100. Converter 98 provides a serial output that is input to one input of a two-to-one multiplexer 102, the other input thereof connected to the one bit input data bus 12. Similarly, the serial output of the converter 100 is connected to one input of the two-to-one multiplexer 104, the other input thereof connected to the input data bus 12. The output multiplexer provides the SDATA1 output 16 and the output of the multiplexer 104 provides the SDATA2 output 18.

A timing control 106 is provided that is operable to generate the various multiplexer select signals for multiplexers 90 and 92 and also multiplexers 102 and 104. The latching signals for the registers 94 and 96 are also controlled thereby. A serial clock signal SCLK is input to the timing control 106 and also to the clock input of the converters 98 and 100. The timing control 106 is controlled by the configuration register to perform the control operations thereof in accordance with the information stored in the configuration register 54. In operation, timing control device 106 is operable to control the multiplexers 90 and 92 to select one of the buses 22, 32, 38, 42 and 48. For example, if the output of bus 22 is selected for output on the SDATA1 output, multiplexer 90 will be controlled to select bus 22. If, at the same time, the output of the noise shaping filter 36 is selected, bus 38 will be selected by multiplexer 92 for output on the SDATA2 serial output. This will require the multiplexer 90 to select the bus 22 and input it to the register 94 during the first one-half of the frame represented by the L/R-BAR signal. At the same time, the 16-bit output on bus 38 will be selected for output from multiplexer 92 and latched into register 96. During the first half of the frame that the L/R-BAR signal is high, the multiplexer 90 will first latch the 24-bit word 20 on bus 22 into the register 94. This will then be processed by the converter 98 for twenty-four bits of the serial clock. During this time, the multiplexer 90 is controlled to select the tag word on bus 48 for input to the register 94. After the twenty-four bits of the data word on bus 22 have been processed by the converter 98, the tag word is then latched into register 94 and output to the converter 98 for conversion to the serial output. Also during the first haft of the frame when the L/R-BAR signal is high, the multiplexer 92 initially selects the 16-bit word on bus 78 for latching into the register 96. Once latched, multiplexer 92 then selects the "0" input. The converter 100 for the first sixteen bits of the frame when L/R-BAR is high, will convert the contents of register 96 to a serial data stream. After the sixteenth bit, the selected "0" output will then be latched into the register 96, this being sixteen bits wide. These sixteen bits of "0" value will then be output in a serial format by the converter 100. During this time, the multiplexers 102 and 104 are operable to select the outputs of the converters 98 and 100, respectively. In the event that the contents of the serial bus 12 are selected, the appropriate one of the multiplexers 102 and 104 will select that output. It is noted that this is a direct output for use in feeding back to the input level.

Figure 7:
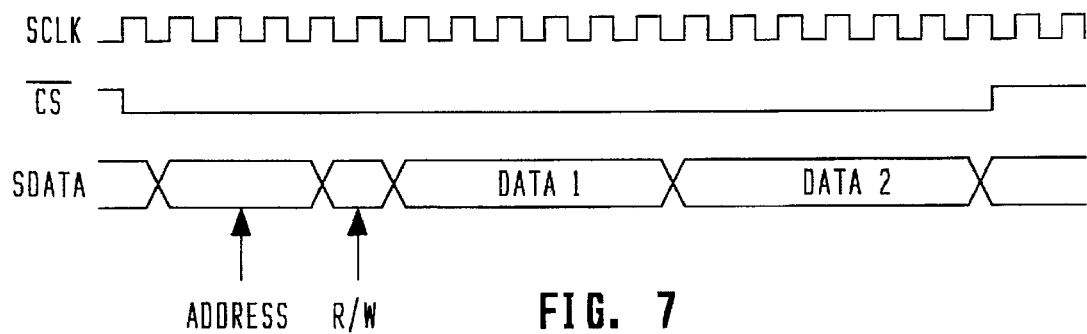
FIG. 7 illustrates a timing diagram for the data input/output operation.

Referring now to FIG. 7, there is illustrated a timing diagram for the data input operation. The data operation requires a serial data clock SCLK, a serial data stream input/output SDATA and a chip select input CS-Bar. This provides for asynchronous operation. Bringing CS-Bar low initiates the beginning of a frame. Thereafter, the first seven bits represent address bits. The next bit is a Read/Write bit. Following the Read/Write bit is a stream of 8-bit data words. When CS-Bar goes high, this indicates the end of a frame and, when CS-Bar goes go low again, another data input operation is initiated. For example, the noise shaping filter response H(z) of the filter 78 can be obtained from either the default ROM 35 or from the coefficient RAM 37. The coefficients in the RAM 37 are downloaded from the SDATA signal on input port 58. This allows the user to program that function. Other internal registers can be utilized for configuration purposes.

Referring now to FIG. 8, there is illustrated a block diagram of the circuitry associated with the data input operation. The CS-Bar input is input to CS-Bar detect circuit 110, which also receives the SCLK signal. The CS-Bar detect circuit 106 is operable to detect a data communication operation. The data on serial bus 58, a bi-directional bus, is clocked into a serial-to-parallel/parallel-to-serial converter 112 during a Write operation which is operable to output a parallel data word on a bi-directional bus 114. The value of the data word on bus 114 continually changes as data is clocked in. At the appropriate time, the sequence of data is latched into a bi-directional latch 115 by the output from the CS-Bar detect circuit 110. Essentially, the CS-Bar detect circuit 110 detects the frame and then sets an internal counter to count a predetermined number of clock cycles to ensure that the address bits, the R/W bit and the data bits are shifted into the converter 112. At this time, the contents are latched in the latch 115 during the Write operation. Thereafter, a portion of the latch is output as the address on address bus 116 to an address decoder 118. The data portion of the information in the latch 115 is output on a bi-directional data bus 120. The R/W bit is output on a line 122. During a Read operation, the Read/Write bit and address bits are latched in the latch 115 and then the date transferred to the latch from the data bus 120 and then input to the parallel input of the converter 112. The data is then clocked out of the serial port of the converter 112 to the serial bus 58.

A register bank 126 is provided, which register bank 126 represents the serial configuration register 54, the coefficient RAM 37 and any other internal registers necessary to configure the system. The data bus 120 and R/W line 122 are input to the register bank 126. The address decoder 118 is operable to output a plurality of address lines 130 which are operable to select the appropriate one of the registers in the register bank 126 for storage of the data therein or retrieval of data therefrom.

Referring now to FIG. 9, there is illustrated a frequency plot for the low group delay FIR filter 30. In order to provide a low group delay, it is necessary to minimize the number of taps required to realize the filter function. A typical filter function would require, for example, a 19 KHz break point or 3 dB rollover point, which would provide an acceptable attenuation at 22 KHz. This is approximately a 3 KHz transition band. This would provide an acceptable level of rejection for a low-pass filter with a conventional response curve for the output of the delta-sigma modulator 10. However, this would require a fairly complex filter with a large number of taps.

Typically, the response to a delta-sigma modulator is that associated with a low-pass filter, i.e., the out-of-band noise is higher than the in-band noise. To facilitate a smaller tap filter, the "sharpness" of the filter is reduced such that the acceptable attenuation occurs at 48 KHz as opposed to 22 KHz. This results in the ROM 34 which has a 29 KHz delta between the 19 KHz rollover and the 48 KHz point, as compared to a sharp filter represented by a dotted line 136. To facilitate the less sharp filter, the passband attenuation of the delta-sigma modulator 10 is extended out to 48 KHz. This utilizes the frequency response of the delta-sigma modulator 10 to provide some of the filtering. As such, the filter function of the low group delay filter 30 can be realized with a smaller filter on the order of 300 taps as opposed to a filter on the order of 2000 taps.

Referring now to FIG. 10, there is illustrated a block diagram of the tag device 46. The 24-bit data on bus 22 is input to an extraction circuit 144 which extracts a portion of the 24-Bit data word and inputs it to a register 138. This can provide a 1 dB resolution necessary for the tag word. The portion being extracted is controlled by a programmable tag bit control register 143. However, the 24-bit data word is output at a 48 KHz word rate and this is not required for the tag word. Rather, the tag word is utilized to drive a level meter. It is, therefore, only necessary to update this periodically and, for the purposes of output, it is only the peak value over a predetermined period of time that is necessary. This period of time that this value needs to be sampled is approximately two milliseconds. Therefore, every two milliseconds, the highest value for the tag word is required for output. To facilitate this, the register 138 is provided that has the output thereof initially set to zero by a reset line 140 and then the output thereof output to a peak detector circuit 142. The other input of the peak detector circuit 142 is connected to the 24-bit word on the data bus after extraction with the window extraction circuit 144, such that only a portion of the 24-Bit word is input to the peak detector circuit 142. The peak detector circuit 142 will then generate an UPDATE signal on a line 146 for register 138 to latch a new value therein. This will only occur when the new value on the bus 22 is higher than the stored value in the register 138. Upon receiving the external signal on the line 140, the output contents on the register 138 are latched into a latch 150 and then the register 138 reset to a value of "0". The latch 150 will then provide the output on the bus 48.

Figure 11A:
FIGS. 11a and 11b illustrates timing diagrams for two different arrangements for mixing the output channels in the two serial outputs.
Figure 11A:
Figure 11B:
Figure 11B:

Referring now to FIGS. 11a and 11b, there are illustrated timing diagrams for two different arrangements for mixing the output channels in the two serial outputs. In FIG. 11a, a first configuration is illustrated wherein two modes are provided for, a first mode and a second mode. The first mode is associated with a select one of the digital processing circuits and the second mode is associated with another of the digital processing circuits or the same digital processing circuit associated with the first mode. The SDATA1 output is configured to output both left and right channels for the first mode and the SDATA0 serial output is configured to output both left and right channels for the second mode. In FIG. 11b, the SDATA1 output is configured to output the left channels of the first and second channels in an alternating fashion. The SDATA2 serial output is configured to output the right channels for both the first and second mode. It is noted that, in this configuration, the serial output must be able to output two different length words in an alternating manner.

Figure 12:
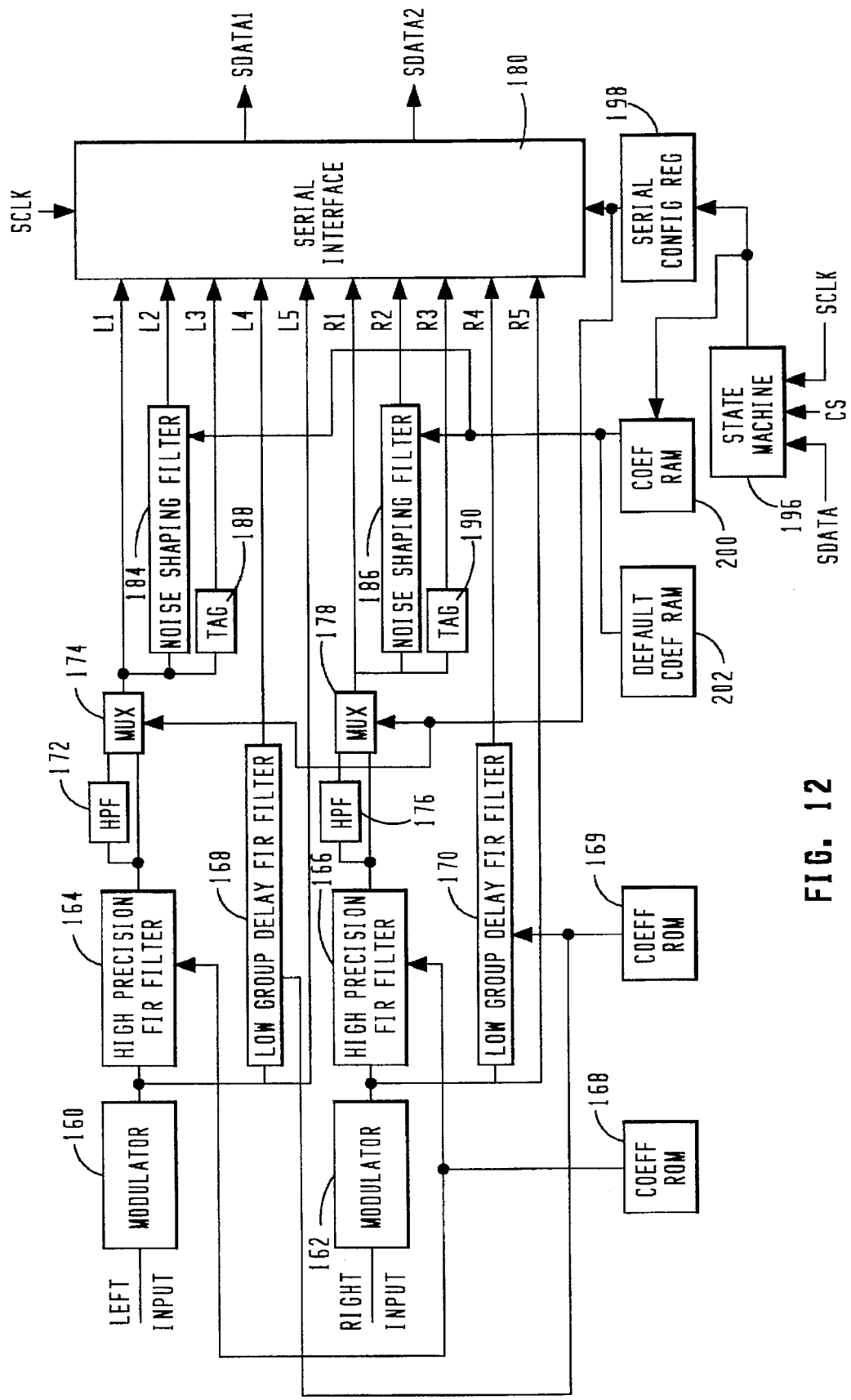
FIG. 12 illustrates a block diagram of a two channel analog-to-digital converter.

Referring now to FIG. 12, there is illustrated a block diagram of a two channel analog-to-digital converter utilizing the serial outputs of the present invention. There are two inputs, a left input for a left channel of an audio program and a right input for the right channel of the audio program. The left input is input to an analog modulator 160 and the right input is input to a modulator 162, modulators 160 and 162 being, in the preferred embodiment, delta-sigma analog modulators. However, they could be any type of data quantizer circuits. The output of modulator 160 is input to a high precision FIR filter 164, similar to the filter 20. Similarly, the output of modulator 162 is input to a high precision FIR filter 166. Both filters 164 and 166 are connected to a coefficient ROM 168, similar to coefficient ROM 36 of FIG. 2. The output of modulator 160 is also input to the input of a low group delay FIR filter 168 and the output of modulator 162 is input to a low group delay FIR filter 170, filters 168 and 170 similar to filter 30 of FIG. 2. Both filters 168 and 170 are connected to a coefficient ROM 169, similar to coefficient ROM 34 of FIG. 2.

The output of filter 164 is input to a high-pass filter 172 and also to the input of a multiplexer 174, the other input of multiplexer 174 connected to the output of the high-pass filter. Similarly, the output of filter 166 is connected to one input of a multiplexer 177, the other input thereof connected to the output of filter 176. Multiplexers 174 and 177 are controlled to select either the output of the respective ones of the filters 172 or 176 or the output of the respective ones of the filters 164 or 166. The output of multiplexer 174 comprises an L1 output, which is input to a serial interface device 180. The output of multiplexer 177 comprises an R1 input to interface 180. Additionally, the output of multiplexer 174 is input to the input of a noise-shaping filter 184, the output thereof comprising an L2 input to the interface 180. Similarly, the output of multiplexer 177 is connected to the input of a noise-shaping filter 186, the output thereof comprising an R2 input to interface 180. Filters 184 and 186 are similar to the filters 36 of FIG. 2. A tag device 188 has the input thereof connected to the output of multiplexer 174, the output thereof comprising an L3 input to interface 180. Similarly, a tag device 190 has the input thereof connected to the output of multiplexer 177 and the output thereof connected to an R3 interface to interface 180, tag devices similar to tag bit device 46 of FIG. 2. The output of the group delay filter 168 comprises an L4 input to interface 180 and the output of group delay filter 170 comprises an R4 input to interface 180. The output of modulator 160 comprises an L5 interface to interface 180 and the output of modulator 162 comprises an R5 input to interface 180. Interface 180 provides two outputs, an SDATA1 output and an SDATA2 output.

A state machine 196 is provided, similar to state machine 62 of FIG. 2, for controlling the system, state machine 196 receiving an SDATA input, a Chip Select Bar input (CS-Bar) and a Serial Clock input (SCLK). The output of state machine 196 controls a serial configuration register 198, similar to register 54 of FIG. 2 and also has a data input connected to a coefficient RAM 200, which contains the operating parameters for the noise-shaping filters 184 and 186. Similarly, a default coefficient ROM 202 is provided, RAM 200 and coefficient ROM 202 similar to RAM 37 and ROM 35, respectively, of FIG. 2.

Figure 13:
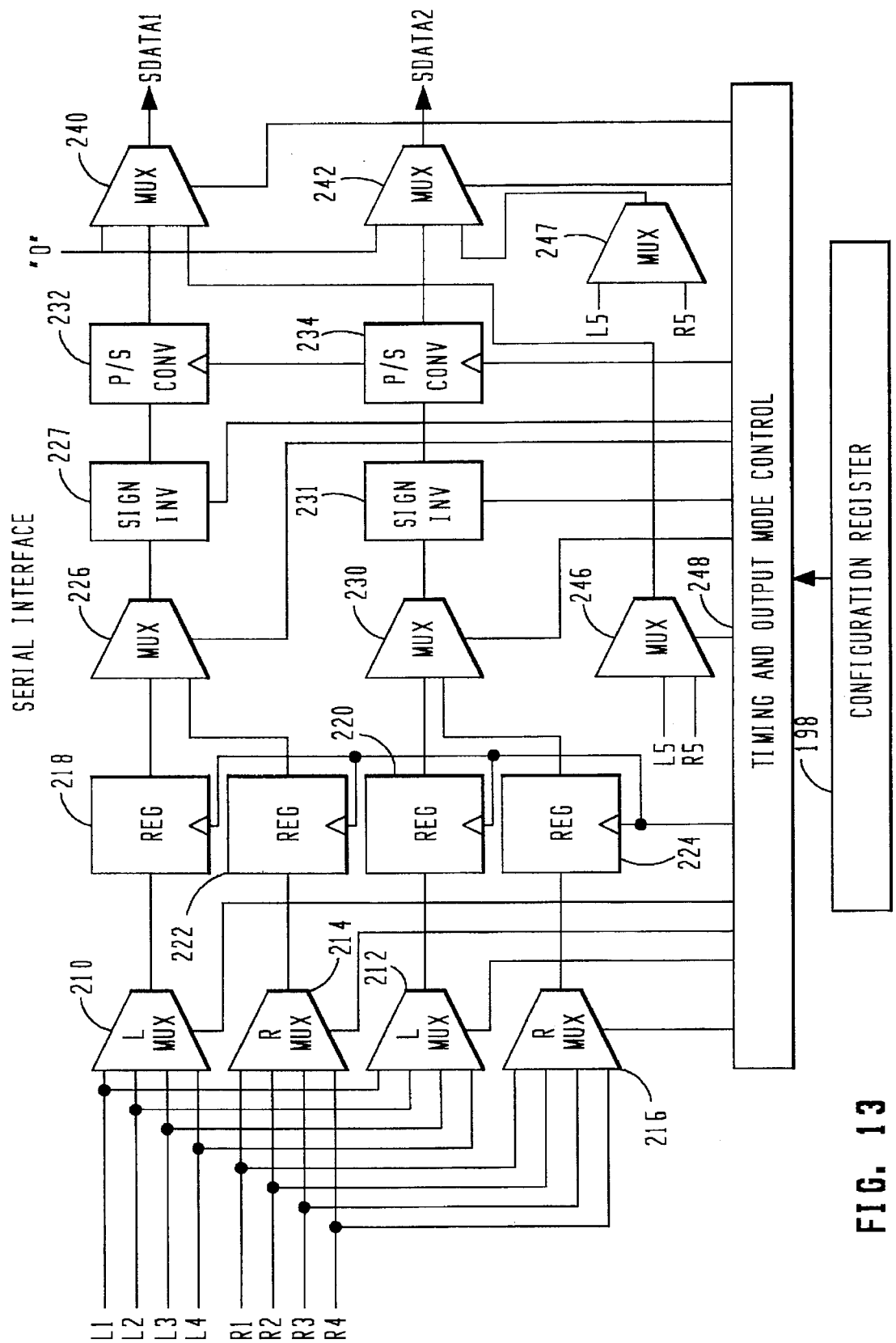
FIG. 13 illustrates a block diagram of the serial interface for the two channel analog-to-digital converter of FIG. 12.

Referring now to FIG. 13, there is illustrated a block diagram of the interface 180. The inputs L1–L4 are input to separate inputs of a four-input multiplexer 210 and also to separate inputs of a four-input multiplexer 212. Similarly, the four inputs R1–R4 are connected to separate inputs of a four-input multiplexer 214 and also to separate inputs of a four-input multiplexer 216. The output of multiplexers 210–216 are connected to the inputs of respective latching registers 218, 220, 222 and 224. The output of registers 218 and 222 are connected to separate inputs of a two-input multiplexer 226, and the outputs of latching registers 220 and 224 are connected to separate inputs of a two-input multiplexer 230. The output of multiplexer 226 is connected to the input of a sign inversion device 227, the output thereof connected to the parallel input of a parallel/serial converter 232. The output of multiplexer 230 is connected to the input of a sign inversion device 231, the output thereof connected to the parallel input of a parallel/serial converter 234. The output of converter 232 is connected to one input of a three-input multiplexer 240 and the output of converter 234 is connected to one input of a three-input multiplexer 242. The L5 and R5 inputs are connected to separate inputs of two two-input multiplexers 246 and 247, the outputs thereof connected to inputs on each of the multiplexers 240 and 242, respectively. The remaining input of the multiplexers 240 and 242 are connected to a "0" value. The output of multiplexer 240 comprises the SDATA1 output, and the output of multiplexer 242 comprises the SDATA2 output.

All the multiplexers, converters and sign inversion devices described above with respect to FIG. 13 are controlled by a timing and output mode control device 248, which receives its input from the configuration register 198. In general, the operation of FIG. 13 is similar to that described hereinabove with respect to the serial interface 52, with the exception that it handles two separate channels and is operable to dispose any of the channels on any of the data outputs. In essence, there are now ten inputs instead of five inputs to be multiplexed. However, once the mode is determined, i.e., whether a particular digital processing device is selected, the system then determines whether it is the left or right channel that is output and how the left or right channel is output, this described above with respect to FIGS. 11a and 11b. The sign inversion devices 227 and 231 allow the system to selectively invert the sign of the stored value in the associated registers prior to output.

In summary, there has been provided an analog-to-digital converter that is comprised of an analog section with an analog delta-sigma modulator and a digital section comprised of a plurality of FIR filters and processing sections. Each of the filters is operable to process the digital data on the output of the analog modulator through a predetermined FIR filter function. This provides multiple outputs. These multiple outputs are then input to a serial interface device that is operable to select one of the outputs and then convert it to a serial data stream for output on one of two outputs. As such, two serial outputs can be provided at the same time. This is facilitated on a single integrated circuit chip to provide a monolithic solution. The configuration for which of the processing functions is selected for output on the serial output is determined by various configuration data that is input and stored in the circuit. This allows the digital processing portion of the circuit to be implemented on a monolithic device.

Although the preferred embodiment has been described in detail, it should be understood that various changes, substitutions and alterations can be made therein without departing from the spirit and scope of the invention as defined by the appended claims.

What is claimed is:

1. An analog-to-digital converter having multiple serial output ports, comprising:

a quantization device for receiving an analog input signal and outputting a digital signal representative of said analog input signal; and a digital processing section for processing said digital output signal to provide at least two serial digital output signals on at least two different ones of the multiple serial output ports, the digital processing section having:

a plurality of digital processing devices each for receiving said digital output signal from said quantization device and processing said digital output signals with a predetermined separate and distinct processing function, each of said digital processing devices providing a processed digital output, a serial interface device for receiving each of said processed digital output signals from the output of each of said digital processing devices and selecting at least one thereof for each of the at least two serial output ports and converting the selected ones of said processed digital outputs for each of the at least two serial output ports to a predetermined serial format, and a configuration device for configuring said serial interface device to determine which of said processed digital output signals are selected in response to receiving external configuration data from a data input.

2. The analog-to-digital converter of claim 1, wherein at least two of said digital processing devices have different word lengths on the output thereof relative to each other.

3. The analog-to-digital converter of claim 2, wherein said predetermined serial format operates at a common word rate such that, when the selected processed digital outputs are associated with the at least two of said digital processing devices having different word lengths, they are output at the same word rate in said predetermined serial format.

4. The analog-to-digital converter of claim 1, wherein a select number of said digital processing devices comprise digital filters and said associated predetermined processing function comprises a Finite Impulse Response (FIR) filter function.

5. The analog-to-digital converter of claim 4, wherein at least two of said digital filters have FIR filter functions with delays associated therewith.

6. The analog-to-digital converter of claim 5, wherein said at least two of said digital filters comprise multi-tap FIR filters.

7. The analog-to-digital converter of claim 6, wherein one of said at least two digital filters has a lower group delay than others and has substantially less taps than others of said at least two digital filters.

8. The analog-to-digital converter of claim 5, wherein the one of said at least two digital filters has a longer group delay than others and a longer word length than others of said at least two digital filters.

9. The analog-to-digital converter of claim 1, and further comprising a post-processing digital processing circuit associated with one of said digital processing devices, the output of said post-processing digital processing circuit comprising one of the inputs to said serial interface device.

10. The analog-to-digital converter of claim 9, wherein said post-processing digital processing circuit comprises a psycho-acoustic digital filter having a shorter word length on the output thereof as compared to the input thereof for shaping the noise response on the output thereof.

11. The analog-to-digital converter of claim 10, and further comprising a psycho-acoustic configuration device for receiving external data which is part of said external configuration data and is operable to define the function of said psycho-acoustic digital filter.

12. The analog-to-digital converter of claim 1, wherein said data configuration device includes a storage device for storing said received external configuration data in response to data received on the data input.

13. The analog-to-digital converter of claim 1, wherein said digital signal output of said quantization device comprises one of the inputs to said serial interface device.

14. The analog-to-digital converter of claim 1, wherein one of said serial outputs is associated with one mode of operation that requires selection of the output of at least one of said digital processing devices and the other of said serial outputs is associated with another mode of operation that requires selection of the output of at least one of said digital processing devices and said configuration device is operable to configure said serial interface device to operate said serial outputs in the associated one of said first and second modes of operation.

15. The analog-to-digital converter of claim 14, wherein each of said first and second modes of operation are associated with multi-channel audio programs.

16. An analog-to-digital converter for receiving two analog input signals and providing serial digital data on two serial outputs, comprising:

a quantization device for receiving the two analog input signals and converting each to a digital representation of the respective analog input signal;

a plurality of digital processing devices each for selectively receiving one of said digital representations of each of said two analog input signals and processing said digital representations from said quantization device with a predetermined separate and distinct processing function, each of said digital processing devices providing a processed digital output for each of said analog input signals and said digital representation thereof output by said quantization device;

a latch device for storing said processed digital output to provide a latched processed digital output for each of said digital processing devices;

a serial interface device for receiving each of said latched processed digital outputs associated with each of said digital processing devices, and selecting at least one thereof for each of said at least two digital serial outputs and converting the selected one of said latched processed digital outputs for each of the two serial outputs to a predetermined serial format; and a configuration device for configuring said serial interface device to determine which of said latched processed digital outputs are selected for output on each of the two serial outputs.

17. The analog-to-digital converter of claim 16, wherein one of the analog inputs comprises a right channel of an audio program and the other of the analog inputs comprises the left channel of the audio program.

18. The analog-to-digital converter of claim 17, wherein said configuration device is operable to control said serial interface device to select one of said latched processed digital outputs for output on one of the two serial outputs and to select one of said latched processed digital outputs for output on the other of the two serial outputs, such that said right channel of the audio program and said left channel of the audio program for the selected one of said latched processed digital outputs are output on only one of the serial outputs.

19. The analog-to-digital converter of claim 18, wherein the ones of said digital processing devices associated with each of said latched processed digital outputs for each of the two serial outputs are different.

20. The analog-to-digital converter of claim 18, wherein at least two of said digital processing devices have different word lengths on the output thereof relative to each other.

21. The analog-to-digital converter of claim 20, wherein said predetermined serial format operates with a common word rate and each of the two serial outputs are associated with a separate one of said latched processed digital outputs, said latched processed digital outputs associated with different ones of said digital processing devices and wherein said latched processed digital outputs for the two serial outputs have different word lengths.

22. The analog-to-digital converter of claim 17, wherein said configuration device is operable to control said serial interface device to select one of said latched processed digital outputs from said latch device for output of the digital representation of the left channel on one of the serial outputs and the digital representation of the right channel on the other serial output and to select another one of the said latched processed digital outputs from said latch device for output of the digital representation of the left channel on the one of the serial outputs and the digital representation of the right channel on the other of the serial outputs, such that the latched digital representations of the left and right channels are interlaced on the respective serial outputs.

23. The analog-to-digital converter of claim 22, wherein at least two of said digital processing devices have different word lengths on the output thereof relative to each other.

24. The analog-to-digital converter of claim 23, wherein the predetermined serial format operates at a common word rate such that, when the one of the latched digital outputs and the another one of the latched digital outputs are associated with the at least two of said digital processing devices with the different word lengths, the latched digital outputs are output at the same word rate in said predetermined serial format and interlaced such that two different word lengths are output on a given one of the serial outputs.

25. A method for converting an analog signal to a digital signal and providing multiple serial output ports in the digital domain comprising the steps of:

receiving an analog input signal and processing it through a quantization device to output a digital signal representative of the analog input signal;

processing the digital output signal through a digital processing section to provide at least two serial digital output signals on at least two different ones of the multiple serial output ports, the step of processing comprising the steps of:

receiving the digital output signal output by the quantization device and processing the received digital output signal through a plurality of digital processing devices, each having a predetermined separate and distinct processing function, each of the predetermined separate and distinct processing functions providing a processed digital output;

receiving each of the processed digital output signals from each of the digital processing devices and selecting at least one thereof for each of the at least two serial output ports and converting the selected ones of the processed digital outputs for each of the at least two serial output ports to a predetermined serial output format with a serial interface device, and configuring the serial interface device to determine which of the processed digital output signals are selected in response to receiving external configuration data from a data input.

26. The method of claim 25, wherein at least two of the digital processing devices have different word lengths on the output thereof relative to each other and the step of processing the received digital output signal through the digital processing devices comprises processing such that the digital outputs have different word lengths on the output of the associated digital processing devices.

27. The method of claim 26, wherein the predetermined serial format operates at a common word rate such that when the selected processed digital outputs are associated with the at least two of the digital processing devices having different word lengths, they are output at the same word rate in the predetermined serial format.

28. The method of claim 26, wherein a select number of the digital processing devices comprise digital filters and the associated predetermined processing function comprises a finite impulse response (FIR) filter function.

29. The method of claim 28, wherein at least two of the digital filters have filter functions with delays associated therewith.

30. The method of claim 25, and further comprising the step of processing the output of one or more of the digital processing devices and providing a post-process digital output to the serial interface device.

31. The method of claim 30, wherein the step of post processing comprises processing the output of one of the digital processing devices through a psycho-acoustic digital filter having a shorter word length on the output thereof relative to the input thereof for shaping the noise response on the output thereof.

32. The method of claim 31, and further comprising receiving external data that defines the operation of the psycho-acoustic digital filter and altering the operation thereof.

33. The method of claim 25, wherein one of the serial outputs is associated with one mode of operation that requires selection of the output of at least one of the digital processing devices and the other of the serial outputs is associated with another mode of operation that requires selection of the output of at least one of the digital processing devices and the step of configuring is operable to configure the serial interface device to operate the serial output and the associated one of the first and second modes of operation.

34. A method for converting an analog signal to a digital signal which is operable to receive two analog input signals and provide serial digital data on two serial outputs, comprising the steps of:

inputting the two analog input signals to a quantization device and processing them therethrough to convert each to a digital representation for the respective analog input signals;

providing a plurality of digital processing devices;

inputting the digital representation of each of the analog input signals to select ones of the digital processing devices and processing the digital representation from the quantization device with a predetermined separate and distinct function in the respective one of the digital processing devices, each of the digital processing devices outputting a processed digital output for the analog input signal and the digital representation thereof output by the quantization device;

storing the processed digital output in a latch device to provide a latched processed digital output for each of the digital processing devices;

inputting each of the latched processed digital outputs associated with each of the digital processing devices into a serial interface device, and selecting at least one thereof for each of the two digital serial outputs and converting the selected one of the latched processed digital outputs for each of the two serial outputs to a predetermined serial output with the serial interface device; and configuring the serial interface device to determine which of the latched digital processed outputs are selected for output on each of the two serial outputs.

35. The method of claim 34, wherein one of the analog inputs comprises a right channel of an audio program and the other of the analog inputs comprises a left channel of the audio program.

36. The method of claim 35, wherein the step of configuring is operable to control the serial interface device to select one of the latched processed digital outputs for output on one of the two serial outputs and to select one of the latched processed digital outputs for output on the other of the two serial outputs, such that the right channel of the audio program and the left channel of the audio program for the selected one of the latched process digital outputs are output on only one of the serial outputs.

37. The method of claim 36, wherein the ones of the digital processing devices associated with each of the latched processed digital outputs for each of the two serial outputs are different.

38. The method of claim 36, wherein at least two of the digital processing devices have different word lengths on the output thereof relative to each other.

39. The method of claim 35, wherein the serial format operates with a common word rate and each of the two serial outputs are associated with a separate one of the latched processed digital outputs, the latched processed digital outputs associated with different ones of the digital processing devices and wherein the latched processed digital outputs for the two serial outputs have different word lengths.

40. The method of claim 35, wherein the step of configuring is operable to control the serial interface device to select one of the latched processed digital outputs from the latch device for output of the digital representation of the left channel thereof on one of the serial outputs and the digital representation of the right channel on the other serial output and to select another one of the latched processed digital outputs from the latch device for output of the digital representation of the left channel thereof on the one of the serial outputs and the digital representation of the right channel on the other of the serial outputs, such that the latched digital representations of the left and right channels are interlaced on the respective serial outputs.

* * * * *